United States Patent [19]

Hubert et al.

[11] Patent Number: 5,160,832
[45] Date of Patent: Nov. 3, 1992

[54] FRONT PANEL UNIT FOR ELECTRONIC EQUIPMENT

[75] Inventors: Thomas G. Hubert, Necedah; Frederick A. Stich; William J. Hazen, both of Wisconsin Rapids; Ricky Mills, Mauston, all of Wis.

[73] Assignee: Best Power Technology, Inc., Necedah, Wis.

[21] Appl. No.: 703,119

[22] Filed: May 17, 1991

[51] Int. Cl.⁵ ............................................ G06C 7/02
[52] U.S. Cl. .......................... 235/145 R; 235/145 A
[58] Field of Search ............... 235/145 R, 145 A, 146

[56] References Cited

U.S. PATENT DOCUMENTS

| | | | |
|---|---|---|---|
| 4,032,729 | 6/1977 | Koistinen | 235/145 R |
| 4,160,886 | 7/1979 | Wright et al. | 235/145 R |
| 4,594,481 | 6/1986 | Wilham et al. | 235/145 R |

Primary Examiner—Richard A. Wintercorn
Assistant Examiner—Eddie C. Lee
Attorney, Agent, or Firm—Foley & Lardner

[57] ABSTRACT

A front panel unit for allowing user communication with electronic equipment includes an injection molded plastic front panel which has integrally formed keys which include are each connected by a spring strip to the body of the front panel. These keypads are depressed by a user and engage microswitches on a PC board which is mounted to the back of the plastic front panel. Openings are provided in the front panel to allow the user to observe visual indicators also mounted on the PC board, such as display lights and alpha numeric display devices. The mounting of the PC board to the front panel is readily accomplished utilizing platforms and retainers which are integrally molded into the front panel to which the PC board is engaged with a snapfit.

7 Claims, 2 Drawing Sheets

FRONT PANEL UNIT FOR ELECTRONIC EQUIPMENT

FIELD OF THE INVENTION

This invention pertains generally to displays and keyboards for various types of electronic equipment and particularly to molded plastic face panels.

BACKGROUND OF THE INVENTION

Many types of electronic equipment include a user interface panel which has various input and output devices. For example, several keys, individually depressible by the user, are commonly provided to allow the user to select operating modes of the equipment or to program information into the equipment. Panels also commonly have display devices such as alphanumeric displays, indicator lights, and so forth.

A common construction for a keyboard for an electronic front panel includes several keys which are mounted to switches on a circuit board behind the front panel, with the keys protruding up through openings in the front panel to positions where they can be accessed by the user. The switches themselves provide the spring action which returns the keys to its normal position after it has been released by the user. Such keys and their associated switches tend to be relatively expensive because of the relative mechanical complexity of and the durability required in the spring returns for the switches. The keys and the switches are typically mounted separately to the front panel display from the other display devices, such as the indicator lights and LED displays, necessitating hand assembly of these display devices to the front panel.

SUMMARY OF THE INVENTION

In accordance with the present invention, a front panel unit for electronic equipment has a front panel formed of a single piece of molded plastic, such as by an injection molding process, in which keys and their return springs are integrally molded with the remainder of the panel. The return springs are strips of plastic, integrally molded with the adjacent plastic panel, which each extend to a raised key accessible to the operator. All portions of the spring strip and the key are separated from the remainder of the front panel except for the edge at which the spring strip is integrally attached to the panel. When the user depresses the key, the cantilever spring strip is bent to allow the back side of the key to contact a microswitch positioned behind the key. The inherent resilience of the plastic material of the spring strip is used to return the key to its normal position.

The one piece molded front panel preferably also has openings formed therein to allow display devices such as LED displays and indicator lights to be viewable by the user. A particular preferred construction includes a printed circuit (PC) board mountable behind the face panel on which are mounted the microswitches, the numeric displays and the indicator lights, all in proper position so that the switches will be positioned behind the keys and the indicator lights and other visual indicators will be located behind openings in the molded front panel. Snap-in retainers are provided in the molded panel to allow the PC board to be snapped into place behind the front panel and to be retained therein with all of the parts in proper position. Thus, only a single step of assembly is required to mount the PC board, with the components already secured thereon, to the front panel without the need to utilize tools. Conversely, the PC board can be easily removed from the front panel for maintenance or replacement.

A face plate area of the front panel is preferably covered by a label, adhered to the front panel body which covers up the slots in the front panel between the cantilever springs and the surrounding panel so that only the protruding keys are viewable by the user. Moreover, the label may also include viewing windows which cover the holes in the molded plastic panel to allow the light from the indicators to pass through while shielding the indicators from dirt, dust, and potential physical damage.

Further objects, features, and advantages of the invention will be apparent from the following detailed description when taken in conjunction with the accompanying drawings.

DETAILED DESCRIPTION OF THE INVENTION

Figure 1:
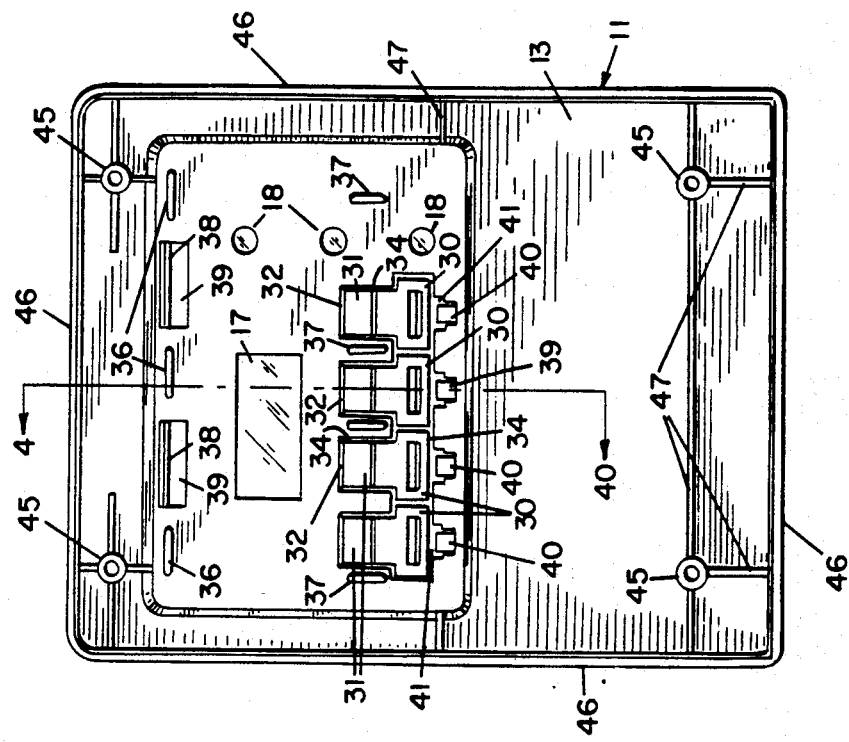
FIG. 1 is an exploded perspective view of the front panel unit of the invention showing the PC board in exploded position with respect to the molded plastic front panel.

With reference to the drawings, an exploded view of the front panel unit of the invention is shown generally at 10 in FIG. 1, being formed of a molded plastic front panel 11 and a printed circuit board unit 12. The printed circuit (PC) board unit 12 is mounted to the back of the front panel 11 in the manner described further below, and is produced separately from the front panel so it can be assembled into place generally as shown in FIG. 1 for combination with the front panel to form the unit 10.

The front panel 11 has a main body portion 13 and a face plate portion 14 with several raised keys 16, a label 15, a display window 17 which allows light from an alphanumeric, or numeric display 24 to shine through, openings 18 for view of indicator lights 25, and various types of indicia 20 which communicate to the user the significance of the adjacent indicia lights at the holes 18. The entire assembled front panel unit 10 is designed to be mounted to the front of a case (not shown) for electronic equipment which may take any desired form.

As illustrated in FIG. 1, the PC board unit 12 includes a flat PC board 22 on which are mounted microswitches 23 at positions which will be located just behind the keys 16 when the PC board unit 12 is mounted to the front panel 11. The PC board unit also includes a display 24, such as a seven segment LED display with multiple digits, indicator lights 25, which may be of different colors, (e.g., red, yellow and green) and various electronic components 27 mounted to the PC board in a conventional fashion at positions away from the openings 17 and 18 in the front panel. A ribbon connector 29 provides electrical connection between the PC board unit 12 and other electrical circuitry within the case for the electronic equipment.

Figure 2:
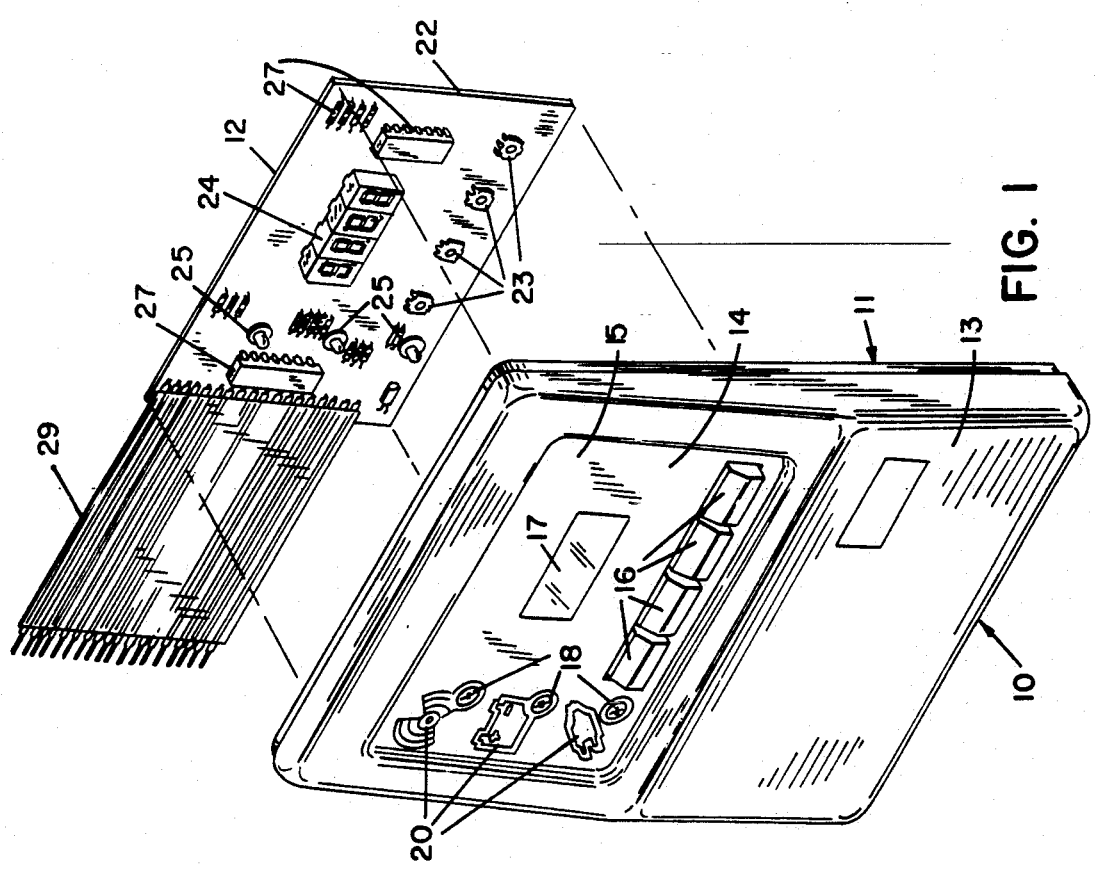
FIG. 2 is a back view of the molded plastic front panel with the PC board removed.
Figure 4:
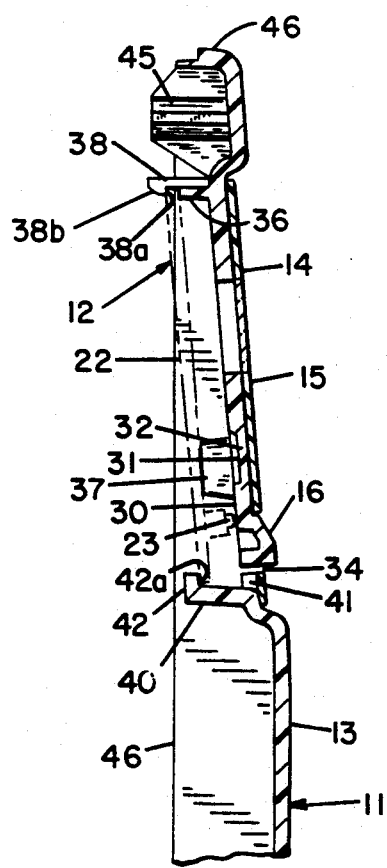
FIG. 4 is a cross-sectional view through the molded plastic front panel of FIG. 2 taken generally along the lines 4—4 of FIG. 2.

The construction of the one piece molded front panel 11 is best shown with respect to the back view of FIG. 2 and the cross-sectional view of FIG. 4. The front panel is preferably produced by standard plastics molding techniques, for example, injection molding, to allow the panel to be produced efficiently and economically with standard molding plastics, such as polystyrene, ABS, and other plastics well known in the art. The material of which the front panel 11 is molded can be selected to best match the expected operating conditions which the front panel must face. A preferred material is high impact polystyrene with an ultra-violet damage inhibitor and a flame retardant incorporated therein.

An exemplary utilization of the front panel unit of the present invention is in an uninterruptible power system in which the panel unit allows user communication with the system, although it is understood the present invention is not limited to such applications but may be utilized with other types of electrical or electronic equipment.

It is a particular advantage of the present invention that the front panel 11 can be formed by injection molding since such techniques allow the efficient and economical production of molded plastic parts. It is also a feature of the present invention that the keys 16, although movable by the user, are nonetheless injection molded in one piece with the remainder of the front panel. This is accomplished as shown in FIG. 2 by having the keys 16, the back faces 30 of which are shown in FIG. 2, integrally connected by thin plastic spring strips 31 to an integral junction 32 at which the spring strips join the body of the face panel 11. At all positions surrounding the spring strips 31 and the keys 16, except at the joints 32, a slot or space 34 is provided between the body of the face panel and these parts. The thickness of the plastic forming the spring strips 31 is preferably thinner than the thickness of the body of the face panel as best illustrated in the cross-sectional view of FIG. 4, to allow the cantilevered plastic spring strip 31 to more readily bend as pressure is applied by a user's finger to the projecting keypad 16. Exemplary thicknesses for the body of the front panel and the spring strips 31 are 0.115 inch and 0.06 inch, respectively, where the front panel is formed of high impact polystyrene. When the pressure on the key is released by the user, the spring strips 31 return the keys 16 to its normal position. Because of the short distance traversed by the key 16 when it is depressed by the user, the spring strips 31 do not fatigue or stretch even over extended use. The relative stiffness of the spring action provided by the spring strips 31 can be selected as desired by selecting the thickness, width, and length of the spring strips 31 relative to the inherent stress-strain properties of the plastic material of which the face panel is molded.

As also illustrated in the cross-sectional view of FIG. 4, the microswitches 23, shown in dashed lines in FIG. 4, are mounted just behind the back sides 30 of the keys 16 so that a microswitch will be contacted when the key 16 above it is depressed by the user.

Figure 3:
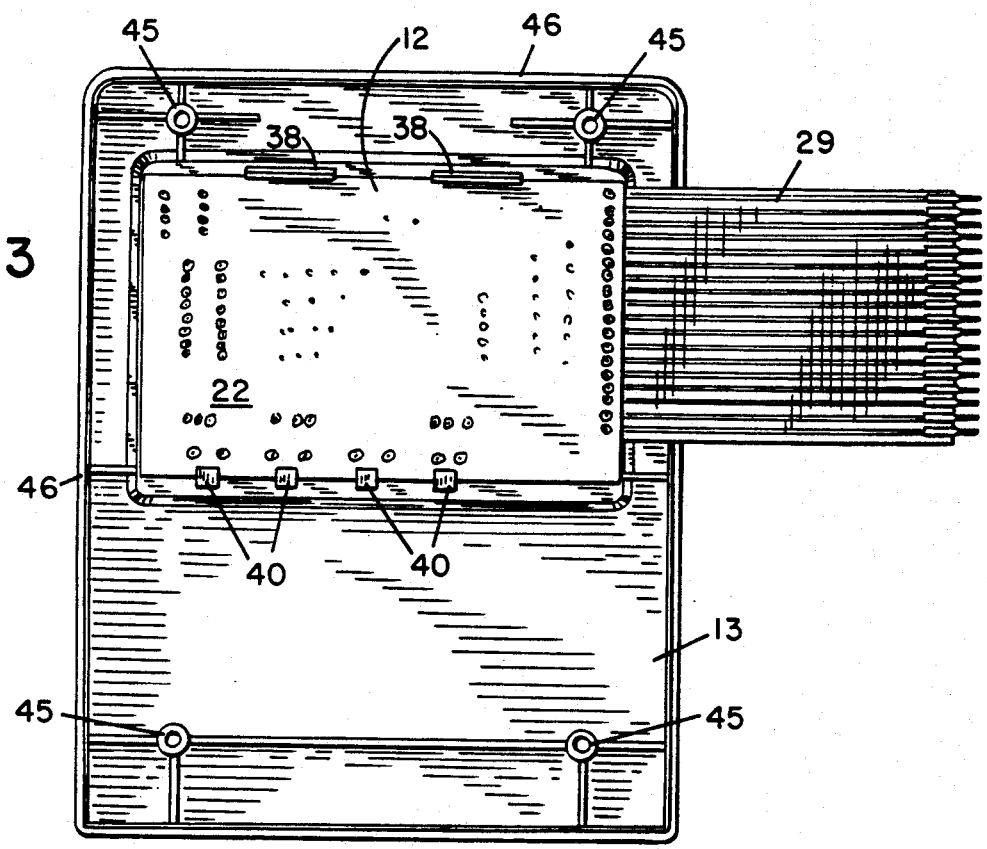
FIG. 3 is a back view of the front panel unit with the PC board in its position where it is retained by the front panel.

The PC board unit 12 is preferably easily mountable in place on the front panel with the microswitches 23 in their proper positions behind the keypads and with the indicator lights 25 and the display 24 in their proper position behind the openings in the front panel. To locate and hold the PC board in its proper position in a simple and inexpensive assembly process, the front panel 11 preferably has means for retaining the PC board in its position on the front panel. These include projecting platforms 36 and 37, the top edges of which engage the surface of the PC board 22 to hold it at a proper position spaced behind the front panel. To hold the PC board tightly down onto the platforms 36 and 37, snap edge retainers 38 are provided to engage the board 22 at its edges. The front panel preferably includes openings 39 beneath the retainers 38 which allow a projecting lip of the retainers 38 to be formed in an injection molding process by extending a tool through the openings 39 to form the retaining back edge 38a of the retainer. The label 15 covers the openings 39 as well as the slots 31 adjacent to the spring strips so these are not visible to a user. A plurality of retainers 40 are formed to engage with the bottom edge of the PC board 22 at positions closely adjacent the back faces 30 of the keypads 16. Again, to allow the retainers 40 to be formed by injection molding, openings 41 are provided in the front panel at positions where a tool is extended through the front panel to form a lip 42 which has a back edge 42a which engages the top surface of the PC board 22, as best shown in FIG. 4. The label 15 also covers the openings 41. As shown in FIG. 3, with the PC board in place, the retainers 38 and 40 clip onto the PC board 22 to hold it in place. The top surfaces 38b of the retainers 38 preferably are slanted with respect to the vertical, as shown, to allow the PC board to be inserted into place by first inserting the lower edge of the board 22 under the retainers 42, and then pressing the top edge of the board against the outer surfaces 38b of the retainers 38 to force them upwardly and out of the way until the PC board snaps into place with its top edge resting against the projecting platforms 36.

The molded plastic front panel 11 also has islands 45 which are formed to allow the front panel to be snapped onto or screwed onto a casing for the electronic equipment. The front panel also preferably includes a skirt rim 46 which extends around the periphery of the panel to allow it to engage with corresponding casing panels, and conventional ribs 47 which are molded into the front panel to reinforce it.

The keys 16 are integrally molded with the remainder of the front panel in an injection molding process, thus eliminating the need to have keys which are formed on the PC board or as separate parts which require assembly, significantly reducing the expense of the front panel unit 10 while providing a rugged, durable and simple construction.

It is understood that the invention is not limited to the particular embodiments set forth herein as illustrative, but embraces such modified forms thereof as come within the scope of the following claims.

What is claimed is:

1. A front panel for electronic equipment allowing communication between a user and the equipment, comprising:
   (a) a one-piece molded plastic front panel having a body portion and a faceplate which is viewable by a user, and at least one protruding key formed therein connected by a spring strip to a junction at which the spring strip is integrally joined to the body portion of the front panel, the key having a back face which is adapted to be engaged against a switch when the key is depressed by the user;
   (b) means integrally molded with the body portion of the front panel for engaging and holding a PC board to the front panel in position such that a switch on the PC board will be behind the key on the front panel, wherein the means for engaging and holding a PC board include projecting platforms integrally molded with the body portion of the front panel which extend backwardly from the front panel to top edges which define a support surface for the PC board, and snap retainers extending backwardly from the front panel formed at positions just adjacent to the edges of the PC board and having overhanging lips which can engage the PC board to hold said PC board in place when the board is pressed in under the lips of the retainers.

2. The front panel of claim 1 wherein there are a plurality of keys, each key connected by a spring strip to the body portion of the front panel.

3. The front panel of claim 1 including openings formed in the faceplate of the front panel to allow visual indicators on the PC board mounted behind the front panel to be observed by the user.

4. The front panel of claim 1 wherein the front panel includes plural keys and further including the PC board mounted in place held under the retainers and having a plurality of microswitches mounted thereon at positions behind the keys on the front panel so as to be contacted by the back of the keys when the keys are depressed by a user, and further including visual indicators mounted to the PC board in position to be visible to the user through openings formed in the front panel.

5. The front panel of claim 1 wherein the front panel is injection molded from polystyrene plastic.

6. A front panel unit for electronic equipment allowing communication between a user and the equipment, comprising:

(a) a one-piece molded plastic front panel having a body portion and a faceplate which is viewable by a user, a plurality of protruding keys formed therein each connected by an integrally molded spring strip to a junction at which the spring strip is integrally joined to the body portion of the front panel, each key having a back face which is adapted to be engaged against a switch when the key is depressed by the user;

(b) a PC board having a plurality of microswitches mounted thereon at positions which are behind the keys on the front panel when the PC board is mounted to the front panel so as to be contacted by the back of the keys when the keys are depressed by a user, and further including visual indicators mounted to the PC board in position to be visible to the user through openings formed in the faceplate of the front panel; and (c) means integrally molded with the body of the front panel for engaging and holding the PC board to the front panel in position such that switches on the PC board will be behind the appropriate keys on the front panel and the visual indicators will be behind the openings in the front panel, wherein the means for engaging and holding the PC board include projecting platforms integrally molded with the body portion of the front panel which extend backwardly from the front panel to top edges which define a support surface for the PC board, and snap retainers extending backwardly from the front panel formed just adjacent to the edges of the PC board and having overhanging lips which can engage the top of the PC board to hold said PC board in place when the board is pressed in under the lips of the retainers.

7. The front panel unit of claim 6 wherein the front panel is injection molded from polystyrene plastic.

* * * * *